United States Patent
Long et al.

(10) Patent No.: US 9,913,376 B2
(45) Date of Patent: Mar. 6, 2018

(54) BRIDGING ELECTRONIC INTER-CONNECTOR AND CORRESPONDING CONNECTION METHOD

(71) Applicant: Northrop Grumman Systems Corporation, Falls Church, VA (US)

(72) Inventors: Anthony L. Long, Redondo Beach, CA (US); Alexander Parra, II, Rolling Hills Estates, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 98 days.

(21) Appl. No.: 15/146,364

(22) Filed: May 4, 2016

(65) Prior Publication Data
US 2017/0325332 A1 Nov. 9, 2017

(51) Int. Cl.
*H01R 9/00* (2006.01)
*H05K 1/14* (2006.01)
*H05K 1/02* (2006.01)
*H05K 1/18* (2006.01)
*H05K 1/11* (2006.01)

(52) U.S. Cl.
CPC ........... *H05K 1/144* (2013.01); *H05K 1/0237* (2013.01); *H05K 1/11* (2013.01); *H05K 1/181* (2013.01); *H05K 2201/10886* (2013.01)

(58) Field of Classification Search
CPC ........ H05K 1/144; H05K 1/0237; H05K 1/11; H05K 1/181; H05K 2201/10886
See application file for complete search history.

(56) References Cited

U.S. PATENT DOCUMENTS

| | | | |
|---|---|---|---|
| 3,868,724 A | 2/1975 | Perrino | |
| 5,602,865 A * | 2/1997 | Laakmann | H01S 3/0975 372/38.1 |
| 6,114,754 A | 9/2000 | Kata | |
| 6,194,651 B1* | 2/2001 | Stark | B64G 1/44 136/244 |
| 7,524,775 B2 | 4/2009 | Ewe et al. | |
| 7,692,590 B2 | 4/2010 | Floyd et al. | |
| 2012/0068316 A1 | 3/2012 | Ligander | |
| 2013/0256850 A1* | 10/2013 | Danny | H01L 23/66 257/664 |

(Continued)

OTHER PUBLICATIONS

Hui Zhang et al; A novel planar interconnection structure with substrate integrated waveguide; Antennas and Propagation (APCAP), 2014 3rd Asia-Pacific Conference on , pp. 1296-1299, Jul. 26-29, 2014.

(Continued)

*Primary Examiner* — Yuriy Semenenko
(74) *Attorney, Agent, or Firm* — Patti & Malvone Law Group, LLC

(57) ABSTRACT

An exemplary bridging inter-connector establishes electrical connections between conductors on a PCB and aligned conductors on a first board mounted to the PCB. A flexible non-conductive sheet covers at least a portion of these conductors. Separated conductive strips on the sheet that are dimensioned to align with and engage at least a portion of both the aligned conductors. A thin film of a bonding agent is disposed on the separated conductive strips and located to engage at least a portion of both aligned conductors to form a conductive connection.

17 Claims, 4 Drawing Sheets

(56) References Cited

U.S. PATENT DOCUMENTS

2015/0028395 A1* 1/2015 Horkheimer ........ B32B 37/1292
257/253

OTHER PUBLICATIONS

S.S. Wen et al; Thermal performance of a power electronics module made by thick-film planar interconnection of power devices; Thermal and Thermomechanical Phenomena in Electronic Systems, 2002. ITHERM 2002. The Eighth Intersociety Conference on, pp. 1097-1101, 2002.

T. Braun et al; 3D stacking approaches for mold embedded packages; Microelectronics and Packaging Conference (EMPC), 2011 18th European, pp. 1-8, Sep. 12-15, 2011.

F. Poprawa et al; A novel planar level chip interconnection for unpackaged MMICs in the millimeter wave frequency range; Semiconductor Conference Dresden (SCD), 2011, pp. 1-4, Sep. 27-28, 2011.

M. Topper et al; Low cost wafer-level 3-D integration without TSV; Electronic Components and Technology Conference, 2009. ECTC 2009. 59th, pp. 339-344, May 26-29, 2009.

S. Seok et al; Design, Fabrication, and Measurement of Benzocyclobutene Polymer Zero-Level Packaging for Millimeter-Wave Applications; Microwave Theory and Techniques, IEEE Transactions on, vol. 55, No. 5, pp. 1040-1045; May 2007.

K. Kikuchi et al; 10-Gbps signal propagation of high-density wiring interposer using photosensitive polyimide for 3D packaging; Electronic Components and Technology Conference, 2006. Proceedings. 56th; pp. 1294-1299.

M. Ohuchi et al; A New LSI Interconnection Method for IC Cards; Components, Hybrids, and Manufacturing Technology, IEEE Transactions on, vol. 10, No. 3, pp. 310-313, Sep. 1987.

* cited by examiner

BRIDGING ELECTRONIC INTER-CONNECTOR AND CORRESPONDING CONNECTION METHOD

BACKGROUND

This invention relates to the inter-connection of two physically separated electronic circuits and more specifically relates an interposer that connects conductive traces/conductors on two physically different boards with each other.

Various types of inter-connections have been utilized to connect electronic circuits on different physical media. For example, wires and cables have been commonly used to connect one circuit/conductive path with another circuit/conductive path. These techniques are commonly used to connect one circuit on a printed circuit board (PCB) with another circuit on a separate PCB. For smaller scales, e.g. integrated circuits (IC), other techniques such as wire bonding have been utilized. For example, an integrated circuit component/die may have a plurality of electronic interconnections made by utilizing a wire bond between a conductive path on the component and a conductive runner/lead associated with the packaged IC. Although wire bonds have been successfully utilized, wire bonding typically requires costly equipment to make the wire bonds. Additional challenges are present where inter-connections are required to couple circuits carrying very high frequency signals which may be adversely impacted if excessive changes in impedance, resistivity or inductive/capacitance effects are encountered due to the inter-connections. There exists a need for a less expensive inter-connector than wire bonding that can accommodate the demands of high-frequency circuits.

SUMMARY

It is an object of the present invention to satisfy this need.

An exemplary bridging inter-connector establishes electrical connections between conductors on a PCB and aligned conductors on a first board mounted to the PCB. A flexible non-conductive sheet covers at least a portion of these conductors. Separated conductive strips on the sheet that are dimensioned to align with and engage at least a portion of both the aligned conductors. A thin film of a bonding agent is disposed on the separated conductive strips and located to engage at least a portion of both aligned conductors to form a conductive connection.

In another embodiment, an electronic assembly includes a PCB, an electronic module on a first board is mounted with the PCB, and a bridging inter-connector as described above establishes connections between conductors on the PCB and first board.

DESCRIPTION OF THE DRAWINGS

Features of exemplary implementations of the invention will become apparent from the description, the claims, and the accompanying drawings in which:

DETAILED DESCRIPTION

One aspect of the present invention resides in the recognition of the difficulties and expense associated with using wire bonds to connect an electronic/IC module with conductors on a PCB, especially where high frequency and/or high power RF signals must be transported over the connection. In accordance with the recognition of this problem, a completely different approach to establishing such inter-connections was conceived and is illustrated in accordance with the embodiments of the invention as described below.

Figure 1:
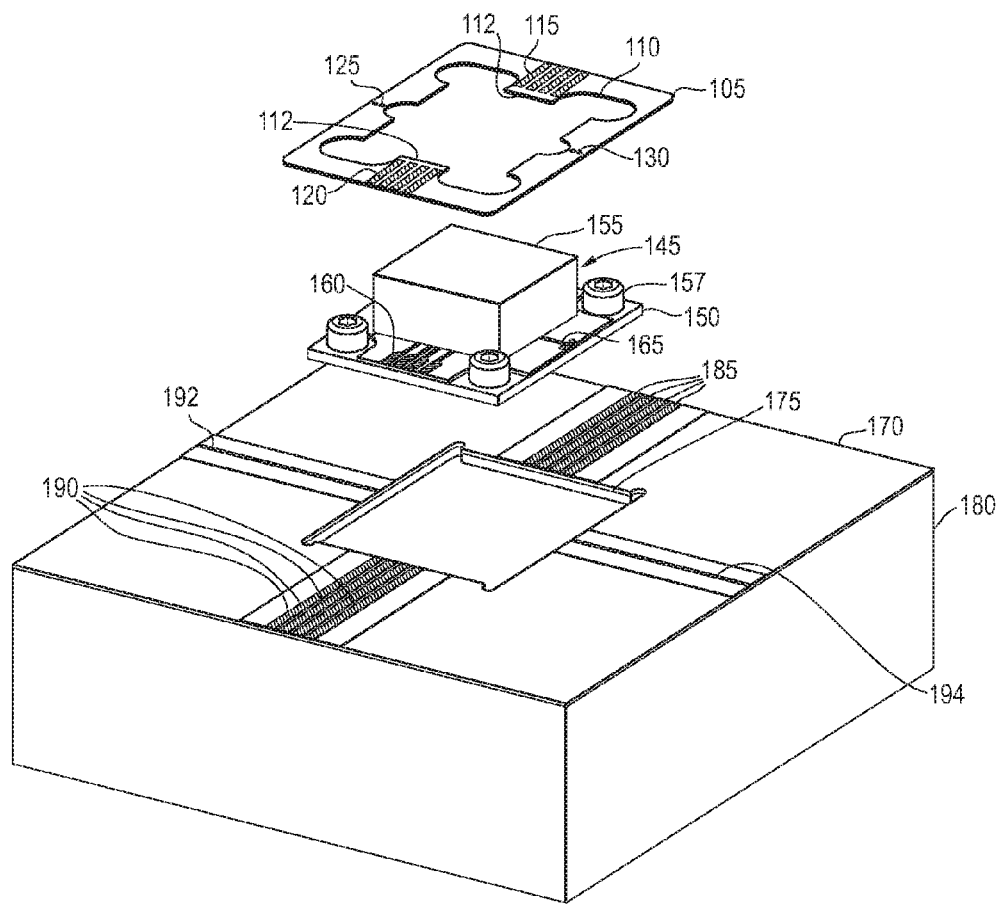
FIG. 1 is an exploded view showing an embodiment of an interposer in accordance with the present invention utilized for an exemplary application.

FIG. 1 shows an exploded view of an embodiment of an interposer 105 in accordance with the present invention as utilized for an exemplary inter-connection application. Interposer 105 is preferably constructed from a thin, low loss, resilient material such as a polyimide film, e.g. DuPont copper-clad laminated composite LF8510R. The interposer 105 contains an interior cut out or opening 110 dimensioned to accept the passage of any parts extending from the board or substrate to be connected to a PCB. Two inwardly extending and opposing projections 112 of the interposer 105 each contain, in the exemplary embodiment, two sets of four conductive strips 115 and 120 on the bottom surface of the interposer 105. In the exemplary embodiment, each of the conductive strips 115 and 120 are formed of copper that is clad to the polyimide film. Similarly, two opposing conductive strips 125 and 130 are also formed on the other sides of interposer 105. As will be explained in more detail below, each of the conductive strips preferably has disposed thereon a thin conductive bonding agent for establishing a conductive attachment between conductive surfaces on the board/substrate and corresponding conductive surfaces on the PCB.

In the exemplary application, the interposer 105 is utilized to establish electrical connections between circuitry on an exemplary electronic module 145, e.g. monolithic microwave integrated circuit (MMIC), and conductors on a PCB 170. Although referenced in the description as being an MMIC, the electronic module can contain any type of electronic circuitry or electronic elements, e.g. one or more antenna elements. The MMIC 145 includes a rigid planar board 150 to which a variety of active and passive components forming various RF circuitry are supported under the housing and shield 155. Capacitors 157 are mounted to board 150 external of the housing as shown. Corresponding to and in alignment to engage with conductive strips 115 and 120 (when assembled), board 150 contains two sets of four conductors 160 which may be utilized to provide input and/or output DC or low frequency AC signals. Similarly, two opposing conductors 165 on board 150 may couple a high frequency RF input signal to and a high frequency and/or high power RF output signal from the MMIC 145. Conductors 125 and 130 of interposer 105 correspond to and are in alignment to engage with the RF input and output conductors, respectively, on board 150 when assembled.

A PCB 170 includes a opening or recess 175 dimensioned to receive the peripheral edges of board 150 in it. A heat sink 180 engages the bottom surface of PCB 170 and preferably engages the bottom surface of board 150 when the latter is disposed within the opening 175. Two sets of four opposing conductive traces 185 are contained on PCB 170 and are dimensioned to align with and engage the conductive strips 115 and 120 on interposer 105 and are also aligned with the respective conductive strips 160 on board 150 of the MIMIC 145. Two opposing microstrip transmission lines 192 and 194 are also contained on the PCB 170 and are disposed to be in alignment with and to be engaged by the conductive strips 125 and 130 of interposer 105 and are in alignment with the respective input and output conductive strips 165 of board 150 when assembled. The PCB 170 and heatsink 180 as shown represents only a portion of a larger PCB and heatsink assembly that will contain a plurality of other active and passive components that will interface and connect with the MIMIC 145 via connections on the PCB 170.

Figure 2:
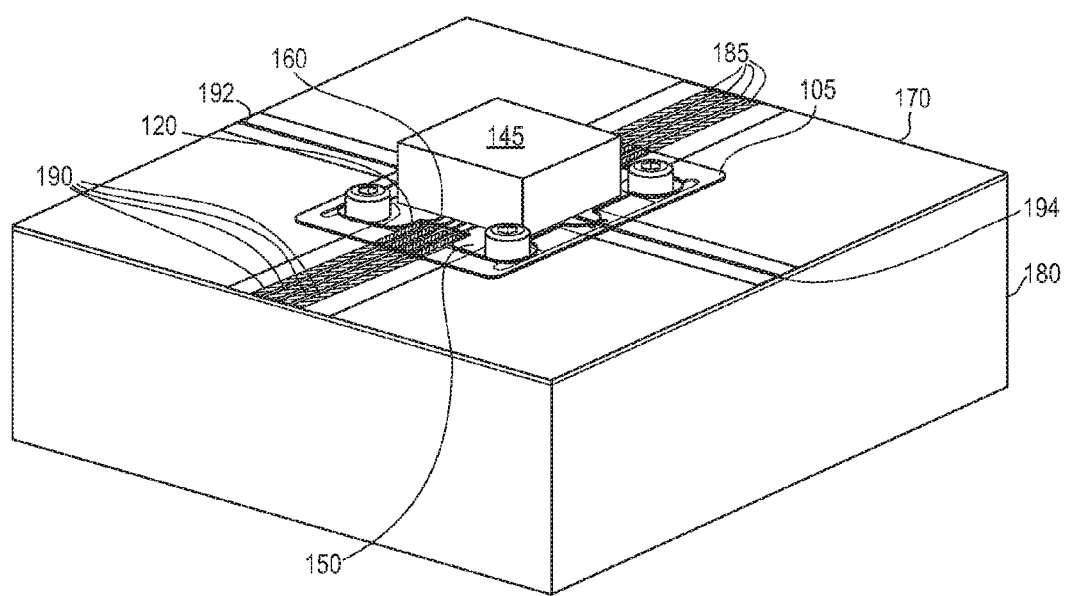
FIG. 2 shows the interposer of FIG. 1 assembled with the exemplary application.

FIG. 2 shows the interposer 105 of FIG. 1 assembled in the exemplary application in which board 150 is seated within the opening 175 of PCB 170. Preferably the depth of the opening 175 in PCB 170 is substantially equal to the thickness of the board 150 so that the top surface of the board 150 and the top surface of PCB 170 are level. Alternatively, filler materials could be used to adjust the height of the surfaces so that the top surfaces of the boards are substantially level. The interposer 105 is dimensioned so that each of the conductive strips 115, 120, 125 and 130 engage both the corresponding conductive strips 160, 165 on board 150 and the corresponding conductive strips 185, 190, 192 and 194 on the PCB 170. Thus, the conductive strips on interposer 105 form a conductive bridge between the respective conductive strips on board 105 and on the PCB 170. In order for board 150 to be easily seated within the opening 175 of the PCB 170, the external dimensions of the board 150 are preferably a little less than the dimensions of the internal edges of the PCB defining the opening 175. This, of course, means that there will exist a small air gap between the edges of the board 150 and the respective edges of the PCB 170 that define the opening 175. The conductive strips of the interposer 105 serves to provide continuity between the respectively aligned conductive strips on the board 150 and the conductive strips on the PCB 170.

Figure 3:
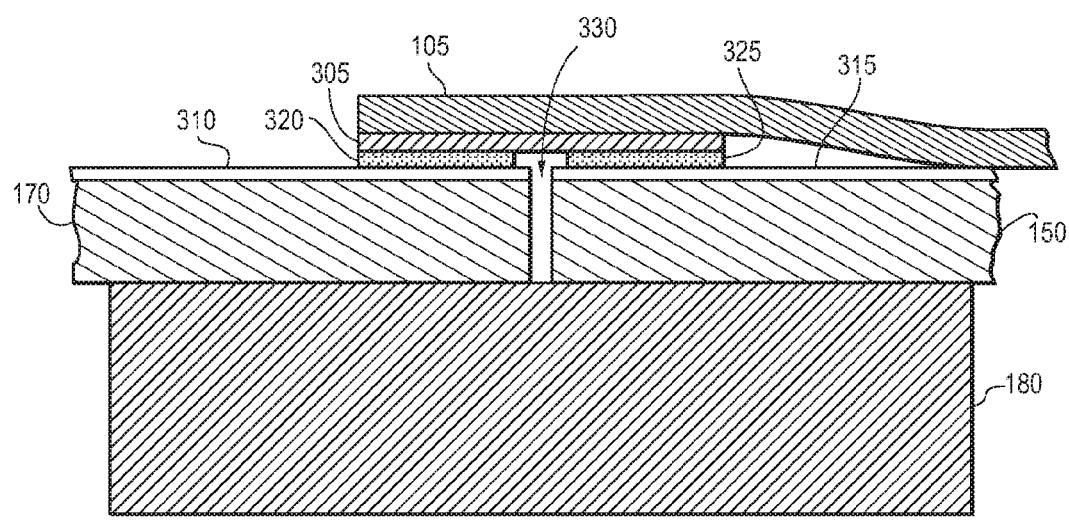
FIG. 3 is a partial cross-sectional view showing a conductive strip on the interposer engaging and forming a conductive connection between respective conductive strips on two separated boards.

FIG. 3 is a partial cross-sectional view showing an exemplary elongated conductive strip 305 such as made of copper on the interposer 105 engaging and forming a conductive connection between conductive strip 310 on PCB 170 and conductive strip 315 on board 150. The external distal end of conductive strip 305 contains a segment 320 of a bonding agent that extends from the distal end of the conductive strip 305 but stops short of the air gap 330. Similarly, the internal distal end of conductive strip 305 contains a segment 325 of a bonding agent that extends from the internal distal end of the conductive strip 305 but again stops short of the air gap 330. Leaving an intermediate portion of the conductive strip 305 opposite and adjacent the air gap 330 of the bonding agent maintains increased flexibility of the intermediate portion of the interposer 105 and prevents undesired bridges or filling-in of the air gap 330. The length of this gap in bonding agent should be approximately three times the thickness of the conductive strip 305. This may be preferred in order to accommodate a potential vertical misalignment between the top surface of the PCB 170 and the top surface of board 150. Alternatively, the bonding agent may be distributed over the entire length of the conductive strip 305 of interposer 105 if maximum flexibility is not a concern. The bonding agent may consist of solder, a conductive epoxy, or a suitable conductive adhesive. The bonding agent may be predisposed on the external surface of the conductive strip 305 prior to assembly or, alternatively, could be placed on the external surfaces of conductive strips 310 and 315 in an area to be engaged by the conductive strip 305 when assembled. In order to minimize adverse impacts that might be caused by such connections where high-frequency and/or high power RF signals traverse the connections, including consideration of impedance variations and high power handling capability, a preferred thickness of bonding agent is 0.5 mil to 2.0 mils. However, if such considerations are not relevant to a particular circuit module to be attached to the PCB, other thicknesses of bonding agents could be utilized. If solder is used as the bonding agent, it may be preferable to electroplate the solder on the conductors 305 of the interposer 105 in order to maintain better control of the thickness of the applied solder. As will be apparent, if solder is utilized as the bonding agent, heat will need to be applied to at least the regions containing the solder following the assembly of the MIMIC 140 into the recess in the PCB 170, and following the placing of the interposer 105 in its final assembled position to melt and adhere the solder to both surfaces.

Figure 4:
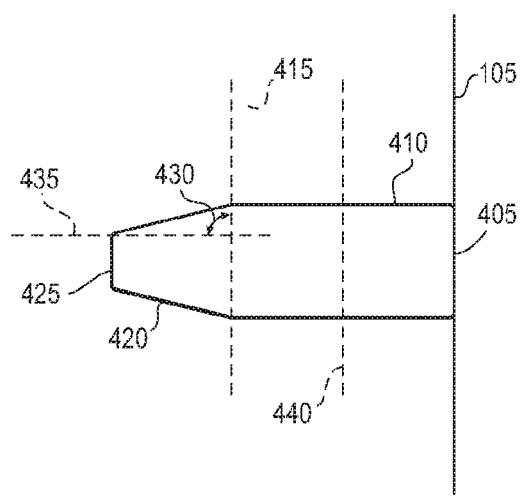
FIG. 4 shows an enlarged view of an exemplary conductive element of the interposer suited to effectively carry a high frequency signal.

FIG. 4 shows an enlarged view of an exemplary conductor 405 of the interposer 105 especially suited for a carrying a high power and/or high frequency RF signal. In the illustrative application, conductor 405 preferably represents each of conductors 125 and 130 as best seen in FIG. 1. The conductor 405 extends perpendicularly inward from the edge of interposer 105 towards the board 150. The conductor 405 includes a section 410 extending from the external distal end to reference line 415 forming an elongated rectangle having a width parallel to the edge of interposer 105 slightly smaller than or equal to the width of the conductor of microstrip 192, 194 disposed on PCB 170. The conductor 405 includes two symmetrical tapering sides 420 extending from reference line 415 to the internal end 425 with the taper having an exemplary angle 430 of 78° between reference line 415 and perpendicular reference line 435. In an exemplary embodiment, the length of section 410 from the reference line 415 to the distal end at the edge of interposer 105 is 0.013 inches and the length of the end 425 parallel to reference line 415 and centered about the longitudinal axis is 0.006 inches. The width of the exemplary corresponding conductor 115 engaged by conductor 405 is 19 mils. Width of section 410 is 16 mils. All dimensions are preferably determined based on an electromagnetic simulation of the structure dependent on the user's particular choices of substrate materials. Simulations of high frequency signals, e.g. 20 GHz and above, have shown that the conductor 405 with the tapered portion provides improved performance in terms of minimizing adverse impedance changes as compared with providing only a conductor having a rectangular shape. In order to maintain increased flexibility to accommodate vertical surface mismatches, it is preferred that the intermediate section of conductor 405 between reference lines 415 and 440 not contain the bonding agent.

Figure 5:
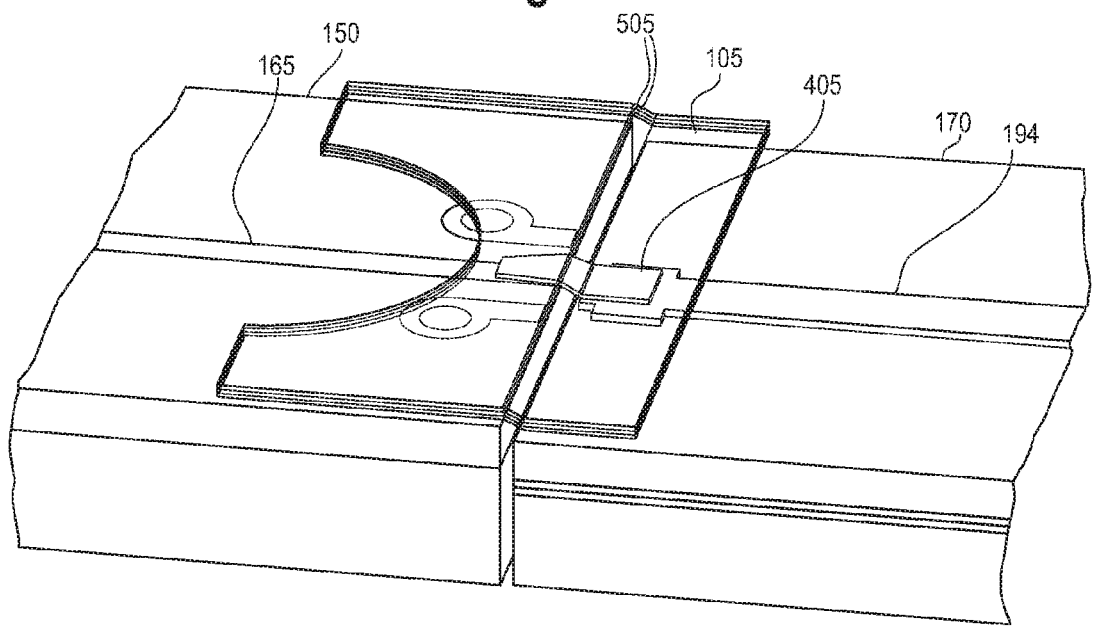
FIG. 5 is a partial view of an interposer in accordance with the present invention illustrating a connection between vertically offset surfaces with conductors to be interconnected.

FIG. 5 is a partial view of an exemplary interposer assembly in accordance with the present invention illustrating an RF connection made by conductor 405 between conductors 194 of PCB 170 and conductor 165 on board 150 where the external surfaces of PCB 170 and board 150 are vertically offset to each other. In the illustrated embodiment, the portion of conductor 405 with tapered sides 420 is bonded to the conductor 165 of board 150 and the rectangular portion of conductor 405 to the right of reference line 440 (FIG. 4) is bonded to conductor 194 of PCB 170. In this example, the surface of board 150 is 2 mils higher than the surface of PCB 170. As seen, section 505 of interposer 105 is sufficiently resilient to flex over this offset so as to permit the bonded end portions of the conductor 405 to make a flat/parallel contact with the respective conductors on board 150 and PCB 170. This flexibility also allows for an amount of subsequent physical movement of the boards relative to each other without causing a break or fracture of the connection. The exemplary conductor 405 maintains good RF transfer characteristics even with such an offset. For example, for an RF signal centered at approximately 28 GHz, the conductor 405 even with a two mil vertical offset between boards, has been simulated to provide a return loss exceeding −30 dB over the range from 25 GHz to 32 GHz. Over this same frequency range, the conductor 405 was simulated to provide an insertion loss of less than −0.257 dB.

Figure 6:
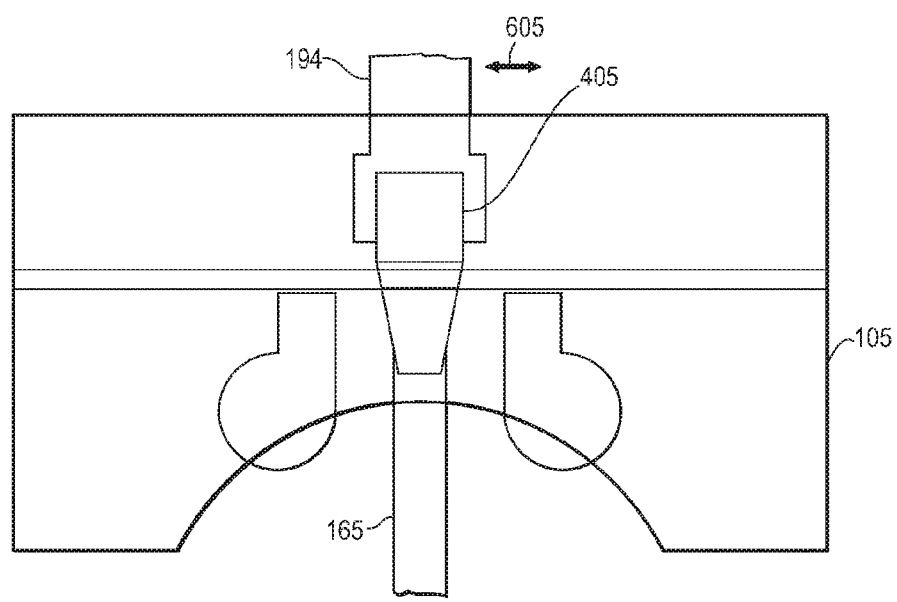
FIG. 6 is a partial view of an interposer showing an exemplary conductive element for which perfect alignment with the conductors to be interconnected may not be achieved.

FIG. 6 is a partial view of an interposer 105 useful in considering lateral misalignment of an exemplary conductive element 405 with the conductors on the PCB 170 and board 150. A lateral direction is indicated by the reference arrows 605. That is, this represents the potential direction for a lateral misalignment of conductor 405 on either side of conductors 194 and 165, which for this example, are assumed to be in alignment. A simulation of RF performance for the exemplary conductor 405 indicates that for a lateral misalignment of the conductor 405 of two mils resulted in a return loss of better than 29 dB across a frequency band of 25 GHz to 32 GHz. A similar simulation showed a return loss of less than 20 dB across the same frequency band with five mils of misalignment. For a lateral misalignment of five mils or less, an insertion loss for the connection made by conductor 405 was simulated to be better than −0.26 dB across this frequency band and had less than 0.05 dB of insertion loss variation. Thus, the conductor 405 as used to bridge connections between the MMIC board and PCB provides an effective connection mechanism with good RF performance even in view of potential misalignment during assembly.

The exemplary interposer provides improvements and advantages for supporting high-frequency and high power RF connections as compared with conventional wire bonds. A simulation shows that a double wire bond is required to substantially equal the performance of the above-described RF connection provided by the interposer in accordance with the present invention. A double wire bond consists of two parallel wire bonds where each provides the same connection between two points. Typically, because of higher inductance provided by a wire bond as contrasted to the RF conductor of the present invention, more complex circuitry is required in a high-frequency RF environment to compensate for the inductance inherently present with the wire bond. Also, a typical wire bond has less RF power and/or DC current carrying capability as contrasted with the RF conductor of the present invention. In addition, the connections provided in accordance with the interposer of the present invention do not require complex and expensive equipment which would be required to install wire bonds.

Making an exemplary interposer in accordance with the present invention may begin by utilizing a flexible film material as suggested above that is copper-clad on one surface. Except for the copper strips to be utilized to provide electrical connections, the remainder of the copper-clad material may be removed such as by etching. If a high-volume is required for a particular interposer, a customized punch may be utilized to make the interior opening in the interposer as required to fit the outline of the circuitry/board to be installed on a PCB. A bonding agent may be disposed on each copper strip, preferably as described above leaving an intermediate section of the copper strip without any bonding agent in order to enhance resiliency in the intermediate section. For example, solder may be electroplated on to the desired areas of each copper strip. As explained above, the geometric configuration of copper strips that will be transporting high frequency RF signals may be advantageously shaped to minimize adverse characteristics associated with the interconnection. After the module to be connected to the PCB is installed on the PCB, the interposer is placed around the module so that the respective conductive strips on the interposer align with and engage the respective conductive paths on the module and PCB. If the bonding agent utilized is solder, an appropriate amount of heat is applied to at least the conductive strip areas of the interposer in order to establish soldered connections.

Although exemplary implementations of the invention have been depicted and described in detail herein, it will be apparent to those skilled in the art that various modifications, additions, substitutions, and the like can be made without departing from the spirit of the invention. For example, the interposer may have an external geometric shape that is other than rectangular and may be utilized to conform to the general shape of the module to be connected to the PCB. As will be apparent, the interposer need not have a closed geometric shape if utilized to connect a module that has connections to be made to the PCB only in a limited area or on a specific side. That is, the interposer could be formed as a single elongated strip with no internal opening where the module to be connected to the PCB has only connections to be made in a region that can be encompassed by the single elongated strip. Also the interposer could be used to couple conductors on adjacent edges of two boards where no portion of either board overlaps or lies within the other board. Alternatively, an interposer could have a plurality of separated interior openings for providing a plurality of interconnections with multiple electronic elements, e.g. making connections with multiple elements of a high frequency RF antenna array where corresponding openings in the interposer accommodate individual elements of the antenna and/or mechanical structures.

The scope of the invention is defined in the following claims.

The invention claimed is:

1. A bridging inter-connector for establishing electrical connections between conductors on a surface of a first board and conductors on a surface of a printed circuit board (PCB) on which the first board is mounted, the conductors on the surface of the first board and the surface of the PCB being aligned to be adjacent to each other, the bridging inter-connector comprising:

a thin flexible sheet of a non-conductive material dimensioned to cover at least a portion of the conductors on the surface of the first board and the surface of the PCB when the thin flexible sheet of a non-conductive material is disposed in an assembled position;

separated conductive strips on one surface of the sheet are dimensioned to align with and engage at least a portion of both the adjacent aligned conductors on the first board and the PCB when the thin flexible sheet of a non-conductive material is disposed in the assembled position;

a thin film of a bonding agent disposed on the separated conductive strips and located to engage at least a portion of both the adjacent aligned conductors on the board and the PCB when the thin flexible sheet of a non-conductive material is disposed in the assembled position;

the conductors on the surface of the first board and the surface of the PCB being disposed adjacent respective edges of the first board and the PCB, and the first board and the PCB disposed substantially within a common plane;

the thin film of bonding agent bonding and securing the separated conductive strips on the thin flexible sheet to the respective conductors on the surface of the first board and the conductors on the surface of the PCB on which the first board is mounted so that the thin flexible sheet is secured to the first board and the PCB by the thin film of bonding agent.

2. The bridging inter-connector of claim 1 where an intermediate region of each of the separated conductive strips does not contain the thin film of the bonding agent to promote flexibility within the intermediate region.

3. The bridging inter-connector of claim 1 wherein the thin film of the bonding agent is solder having a thickness between 0.5 mils and 2.0 mils.

4. The bridging inter-connector of claim 1 wherein, when the thin flexible sheet of a non-conductive material is disposed in the assembled position, the thin film of the bonding agent disposed on the separated conductive strips engage at least a portion of both the adjacent aligned conductors on the first board and PCB and form a conductive bond via the associated conductive strip between the adjacent aligned conductors on the board and PCB, the conductive bond capable of carrying more electrical power than if a wire bond was used to connect the same adjacent aligned conductors.

5. The bridging inter-connector of claim 4 wherein, when the thin flexible sheet of a non-conductive material is disposed in the assembled position, the conductive bond has 0.5 or less of the inductance that would exist if a wire bond was used to connect the same adjacent aligned conductors.

6. The bridging inter-connector of claim 1 wherein at least one of the separated conductive strips will form a conductive connection to carry a high frequency radio frequency (RF) signal from a first conductor the first board to a corresponding first conductor on the PCB, the at least one of the separated conductive strips having a body with a first width and one distal end portion that tapers from the first width to a lesser width at the associated distal end, the one distal end portion of the at least one of the separated conductive strip disposed on the thin flexible sheet of a non-conductive material to engage the first conductor on the board to maximize a consistent RF impedance at the conductive connection with the RF impedance of the first conductor.

7. A bridging inter-connector for establishing electrical connections between conductors on a surface of a first board and conductors on a surface of a printed circuit board (PCB) on which the first board is mounted, the conductors on the surface of the first board and the surface of the PCB being aligned to be adjacent to each other, the bridging inter-connector comprising:

a thin flexible sheet of a non-conductive material dimensioned to cover at least a portion of the conductors on the surface of the first board and the surface of the PCB when the thin flexible sheet of a non-conductive material is disposed in an assembled position;

separated conductive strips on one surface of the sheet are dimensioned to align with and engage at least a portion of both the adjacent aligned conductors on the first board and the PCB when the thin flexible sheet of a non-conductive material is disposed in the assembled position;

a thin film of a bonding agent disposed on the separated conductive strips and located to engage at least a portion of both the adjacent aligned conductors on the board and the PCB when the thin flexible sheet of a non-conductive material is disposed in the assembled position, the thin flexible sheet of the non-conductive material having an interior opening dimensioned to allow components on the first board to fit within the opening when the thin flexible sheet of the non-conductive material is disposed in the assembled position.

8. The bridging inter-connector of claim 7 wherein the thin flexible sheet of the non-conductive material has an exterior peripheral dimension that is larger than an exterior peripheral dimension of the first board.

9. A bridging inter-connector for establishing electrical connections between conductors on a surface of a first board and conductors on a surface of a printed circuit board (PCB) on which the first board is mounted, the conductors on the surface of the first board and the surface of the PCB being aligned to be adjacent to each other, the bridging inter-connector comprising:

a thin flexible sheet of a non-conductive material dimensioned to cover at least a portion of the conductors on the surface of the first board and the surface of the PCB when the thin flexible sheet of a non-conductive material is disposed in an assembled position;

separated conductive strips on one surface of the sheet are dimensioned to align with and engage at least a portion of both the adjacent aligned conductors on the first board and the PCB when the thin flexible sheet of a non-conductive material is disposed in the assembled position;

a thin film of a bonding agent disposed on the separated conductive strips and located to engage at least a portion of both the adjacent aligned conductors on the board and the PCB when the thin flexible sheet of a non-conductive material is disposed in the assembled position;

a gap existing between the peripheral edge of the first board and an adjacent edge of the opening of the PCB;

an intermediate region of each of the separated conductive strips does not contain the thin film of the bonding agent, the intermediate region being adjacent the gap when the thin flexible sheet of a non-conductive material is disposed in the assembled position so that a vertical offset of the surface of the first board relative to the surface of the PCB can be accommodated by flexibility of the intermediate region of the thin flexible sheet of the non-conductive material.

10. An electronic assembly comprising:

a printed circuit board (PCB) with PCB conductors on a surface of the PCB board;

an electronic module mounted on a surface of a first board with first conductors on the surface of the first board to carry signals associated with the electronic module;

the PCB having an interior opening dimensioned to receive therein a peripheral edge of the first board with a gap being between the peripheral edge of the first board and an interior edge of the PCB defining the opening;

a bridging inter-connector with conductive strips that engage the first conductors and corresponding PCB conductors that are aligned and adjacent to corresponding first conductors, each conductive strip establishing an electrical connection between one of the first conductors and a corresponding aligned PCB conductor, the bridging inter-connector comprising:
- a thin flexible sheet of a non-conductive material dimensioned to cover at least a portion of the first conductors and the corresponding PCB conductors;
- a thin film of a bonding agent disposed on each of the conductive strips and located to engage at least a portion of the first conductors and the respective PCB conductors.

11. The electronic assembly of claim 10 where an intermediate region of each of the conductive strips does not contain the thin film of the bonding agent to promote flexibility within the intermediate region.

12. The electronic assembly of claim 10 wherein the surface of the first board and the surface of the PCB are substantially, the thin flexible sheet of the non-conductive material dimensioned to cover the gap at least at locations where first conductors are present and to cover at least a portion of each first conductor and the corresponding PCB conductor.

13. The electronic assembly of claim 12 wherein an intermediate region of each of the conductive strips does not contain the thin film of the bonding agent, the intermediate region being opposite the gap so that a vertical offset of the surface of the first board relative to the surface of the PCB can be accommodated by flexibility within the intermediate region of the thin flexible sheet of the non-conductive material.

14. The electronic assembly of claim 10 wherein the thin film of the bonding agent is solder having a thickness between 0.5 mils and 2.0 mils.

15. The electronic assembly of claim 10 wherein the thin film of the bonding agent disposed on the conductive strips engage at least a portion of both the adjacent aligned conductors on the first board and PCB and forms a conductive bond therebetween via the associated conductive strip, the conductive bond capable of carrying electrical power more than 1.5 times that of a wire bond if used to connect the same adjacent aligned conductors.

16. The electronic assembly of claim 15 wherein the conductive bond has less than 0.6 times the inductance that would exist if a wire bond was used to connect the same adjacent aligned conductors.

17. The electronic assembly of claim 10 wherein at least one of the conductive strips forms a conductive connection to carry a high frequency radio frequency (RF) signal greater than 20 GHz between a first conductor on the first board and a corresponding first conductor on the PCB, the at least one conductive strip having a generally rectangular body with a first width, one end region of the body tapers from the first width at an intermediate location of the body to a lesser width at the end of the one end region, the one end region having a planar surface that engages an aligned first conductor on the first board to provide a conductive connection having an RF impedance with less than 20 dB return loss with a lateral misalignment of 5 mils of a longitudinal center line of the one end region with a longitudinal center line of the aligned first conductor.

* * * * *